United States Patent
Gao et al.

(10) Patent No.: US 10,707,077 B2
(45) Date of Patent: Jul. 7, 2020

(54) METHOD AND DEVICE FOR MANUFACTURING LOW TEMPERATURE POLY-SILICON, AND LASER ASSEMBLY

(71) Applicant: BOE TECHNOLOGY GROUP CO., LTD., Beijing (CN)

(72) Inventors: Tao Gao, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 34 days.

(21) Appl. No.: 16/113,776

(22) Filed: Aug. 27, 2018

(65) Prior Publication Data

US 2019/0304782 A1 Oct. 3, 2019

(30) Foreign Application Priority Data

Mar. 27, 2018 (CN) .......................... 2018 1 0258840

(51) Int. Cl.
| | | |
|---|---|---|
| *H01L 21/02* | (2006.01) | |
| *B23K 26/08* | (2014.01) | |
| *H01L 21/67* | (2006.01) | |
| *B23K 26/354* | (2014.01) | |
| *B23K 103/00* | (2006.01) | |
| *B23K 101/40* | (2006.01) | |
| *H01L 27/12* | (2006.01) | |

(52) U.S. Cl.
CPC ...... *H01L 21/02683* (2013.01); *B23K 26/083* (2013.01); *H01L 21/02532* (2013.01); *H01L 21/02592* (2013.01); *H01L 21/67115* (2013.01); *B23K 26/354* (2015.10); *B23K 2101/40* (2018.08); *B23K 2103/56* (2018.08); *H01L 27/1274* (2013.01)

(58) Field of Classification Search
CPC ................................................ H01L 21/02683
See application file for complete search history.

(56) References Cited

U.S. PATENT DOCUMENTS

| 533,262 A | 1/1895 | Alford |
|---|---|---|
| 2013/0234330 A1 | 9/2013 | Theuss |

(Continued)

FOREIGN PATENT DOCUMENTS

| CN | 87207366 U | 9/1988 |
|---|---|---|
| CN | 101853789 A | 10/2010 |

(Continued)

OTHER PUBLICATIONS

First Chinese Office Action dated Feb. 3, 2020, received for corresponding Chinese Application No. 201810258840.6, 22 pages.

*Primary Examiner* — Yu-Hsi D Sun
(74) *Attorney, Agent, or Firm* — Kinney & Lange, P.A.

(57) ABSTRACT

A method and device for manufacturing low temperature poly-silicon, and a laser assembly are provided. A method for manufacturing low temperature poly-silicon includes forming an amorphous silicon layer on a substrate; controlling a relative movement of a laser assembly to the substrate in a direction perpendicular to a thickness of the substrate, and controlling a laser beam emitted from the laser assembly to irradiate the amorphous silicon layer on the substrate, to recrystallize an amorphous silicon in a region to be irradiated with the laser beam in the amorphous silicon layer. In a direction of the substrate moving relative to the laser assembly, energy of the laser beam emitted by the laser assembly in a same period of time decreases gradually.

20 Claims, 6 Drawing Sheets

(56) References Cited

U.S. PATENT DOCUMENTS

| | | |
|---|---|---|
| 2014/0138695 A1 | 5/2014 | Tian et al. |
| 2014/4013869 | 5/2014 | Tian et al. |

FOREIGN PATENT DOCUMENTS

| | | |
|---|---|---|
| CN | 102097368 A | 6/2011 |
| CN | 102969250 A | 3/2013 |
| CN | 103311222 A | 9/2013 |
| CN | 104362115 A | 2/2015 |
| CN | 104404617 A | 3/2015 |
| CN | 104979247 A | 10/2015 |
| JP | 2002064060 A | 2/2002 |
| JP | 2002313726 A | 10/2002 |

METHOD AND DEVICE FOR MANUFACTURING LOW TEMPERATURE POLY-SILICON, AND LASER ASSEMBLY

CROSS-REFERENCE TO RELATED APPLICATION

The present application claims priority to Chinese Patent Application No. 201810258840.6 filed on Mar. 27, 2018, which is incorporated herein by reference in its entirety.

TECHNICAL FIELD

The present disclosure relates generally to the field of display technologies, and in particular, for example, to a method and device for manufacturing low temperature poly-silicon, and a laser assembly.

BACKGROUND

An active layer in a thin film transistor is made of low temperature poly-silicon (LTPS) or amorphous silicon (a-Si). The low temperature poly-silicon has superior physical electrical properties to the amorphous silicon. A complementary metal oxide semiconductor (CMOS) made of the low temperature poly-silicon, which is a gate driver on array (GOA) circuit, may be directly made on a substrate. Adopting a GOA circuit made of the low temperature poly-silicon may reduce the quantity of pins on an external printed circuit board and the quantity of wire connection points, thereby decreasing defects of a display panel, and prolonging its service life.

In the related art, a method for manufacturing low temperature poly-silicon includes Solid Phase Crystallization (SPC), Metal Induced Crystallization (MIC), and Excimer Laser Anneal (ELA), where the ELA is most widely used. In ELA, an excimer laser beam irradiates on an amorphous silicon thin film on the substrate for a while, the amorphous silicon thin film is melted at a high temperature, and melted amorphous silicon is to be cooled and recrystallized rapidly, thereby forming a low temperature poly-silicon thin film.

SUMMARY

A method for manufacturing low temperature poly-silicon, including: forming an amorphous silicon layer on a substrate; and controlling a relative movement of a laser assembly to the substrate in a direction perpendicular to a thickness of the substrate, and controlling a laser beam emitted from the laser assembly to irradiate the amorphous silicon layer on the substrate, to recrystallize an amorphous silicon in a region to be irradiated with the laser beam in the amorphous silicon layer; where in a direction of the substrate moving relative to the laser assembly, energy of the laser beam emitted by the laser assembly in a same period of time decreases gradually.

In some embodiments, the laser assembly includes a laser emitter and an optical thin film; where the laser emitter is configured to emit a laser beam with substantially uniform energy, and includes a laser egress; the optical thin film is fixed on the laser egress; and in the direction of the substrate moving relative to the laser assembly, a transmittance of the optical thin film decreases gradually, to gradually reduce the energy of the laser beam emitted by the laser assembly in the same period of time.

In some embodiments, a surface of the optical thin film away from the laser emitter has a step shape or is oblique, and a surface of the optical thin film close to the laser emitter is flat.

In some embodiments, a surface of the optical thin film away from the laser emitter is flat, and a surface of the optical thin film close to the laser emitter has a step shape or is oblique.

In some embodiments, the optical thin film has a minimal transmittance Xmin and a maximal transmittance Xmax, where 1%≤Xmin<Xmax≤100%.

In some embodiments, the laser assembly includes a laser emitter and an optical thin film; the laser emitter is configured to emit a laser beam with substantially uniform energy; the optical thin film is hung between the laser emitter and the amorphous silicon layer, the laser beam emitted from the laser emitter is incident onto the optical thin film, and the optical thin film has a constant position relative to the laser emitter; and in the direction of the substrate moving relative to the laser assembly, a transmittance of the optical thin film decreases gradually, to gradually reduce the energy of the laser beam emitted by the laser assembly in the same period of time.

In some embodiments, a surface of the optical thin film away from the laser emitter has a step shape or is oblique, and a surface of the optical thin film close to the laser emitter is flat.

In some embodiments, a surface of the optical thin film away from the laser emitter is flat, and a surface of the optical thin film close to the laser emitter has a step shape or is oblique.

In some embodiments, the optical thin film has a minimal transmittance Xmin and a maximal transmittance Xmax, where 1%≤Xmin<Xmax≤100%.

In some embodiments, in the direction of the substrate moving relative to the laser assembly, the energy of the laser beam emitted by the laser assembly in the same period of time has at least three different values.

In some embodiments, in the direction of the substrate moving relative to the laser assembly, the laser beam emitted from the laser assembly has a width ranging from 0.4 mm to 1 mm.

A device for manufacturing low temperature poly-silicon, including a table, a moving structure and a laser assembly, where the table is configured to place a substrate; the moving structure is configured to drive the laser assembly and the substrate to move relative to each other gradually in a direction perpendicular to a thickness of the substrate; the laser assembly is configured to emit a laser beam, where the laser beam irradiates an amorphous silicon layer on the substrate, to recrystallize an amorphous silicon in a region to be irradiated with the laser beam in the amorphous silicon layer; in a direction of the substrate moving relative to the laser assembly, energy of the laser beam emitted by the laser assembly in a same period of time decreases gradually.

In some embodiments, the laser assembly includes a laser emitter and an optical thin film; where the laser emitter is configured to emit a laser beam with substantially uniform energy, and includes a laser egress; the optical thin film is fixed on the laser egress; and in the direction of the substrate moving relative to the laser assembly, a transmittance of the optical thin film decreases gradually, to gradually reduce the energy of the laser beam emitted by the laser assembly in the same period of time.

In some embodiments, a surface of the optical thin film away from the laser emitter has a step shape or is oblique, and a surface of the optical thin film close to the laser emitter is flat.

In some embodiments, a surface of the optical thin film away from the laser emitter is flat, and a surface of the optical thin film close to the laser emitter has a step shape or is oblique.

In some embodiments, the optical thin film has a minimal transmittance Xmin and a maximal transmittance Xmax, where $1\% \leq Xmin < Xmax \leq 100\%$.

In some embodiments, the laser assembly includes a laser emitter and an optical thin film; the laser emitter is configured to emit a laser beam with substantially uniform energy; the optical thin film is hung between the laser emitter and the amorphous silicon layer, the laser beam emitted from the laser emitter is incident onto the optical thin film, and the optical thin film has a constant position relative to the laser emitter; and in the direction of the substrate moving relative to the laser assembly, a transmittance of the optical thin film decreases gradually, to gradually reduce the energy of the laser beam emitted by the laser assembly in the same period of time.

In some embodiments, a surface of the optical thin film away from the laser emitter has a step shape or is oblique, and a surface of the optical thin film close to the laser emitter is flat.

In some embodiments, a surface of the optical thin film away from the laser emitter is flat, and a surface of the optical thin film close to the laser emitter has a step shape or is oblique.

A laser assembly, including a laser emitter and an optical thin film; where the laser emitter is configured to emit a laser beam with substantially uniform energy, and includes a laser egress; the optical thin film is arranged on the laser egress; or, the optical thin film is hung at one side of the laser emitter arranged with the laser egress, the laser beam emitted from the laser emitter is incident onto the optical thin film, and the optical thin film has a constant relative position to the laser emitter; and from a first end of the optical thin film to a second end opposite to the first end of the optical thin film, a transmittance of the optical thin film decreases gradually, to gradually reduce the energy of a laser beam emitted by the laser assembly in a same period of time.

REFERENCE NUMERALS

11—amorphous silicon thin film; 13—laser; 20—substrate; 1—lower buffer layer; 22—upper buffer layer; 23—amorphous silicon layer; 30—laser assembly; 31—laser emitter; 32—optical thin film.

DETAILED DESCRIPTION

Figure 1:
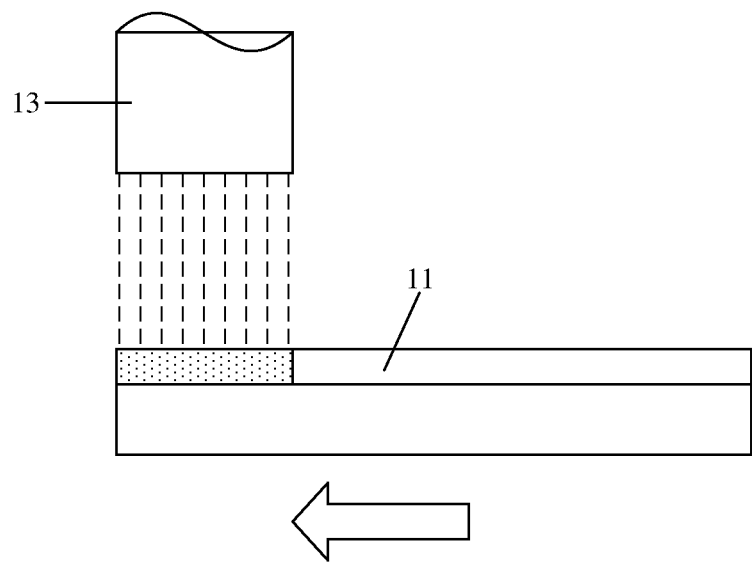
FIG. 1 is a schematic diagram of a process for manufacturing a low temperature poly-silicon according to a related art.

A crystal grain grows from a position with a relatively low temperature to a position with a relatively high temperature. Based on this, as shown in FIG. 1, when an amorphous silicon thin film 11 is irradiated with a laser beam emitted from a laser 13 where the laser beam has a width of 0.4 mm, a part of the amorphous silicon thin film 11 in a region to be irradiated with the laser beam is irradiated with a laser beam under a same temperature. Therefore, crystal grains of a low temperature poly-silicon grow within the region randomly, which leads to a small size of the crystal grains in the low temperature poly-silicon, further increasing the quantity of crystal boundaries of the low temperature poly-silicon. In the case that an active layer in a thin film transistor is made of the low temperature poly-silicon with a large quantity of crystal boundaries, the larger the quantity of the crystal boundaries, the more easily the active layer is conductive, thereby increasing a leak current of the thin film transistor, causing an unstable threshold voltage of the thin film transistor, and decreasing the stability and reliability of the thin film transistor.

Figure 2:
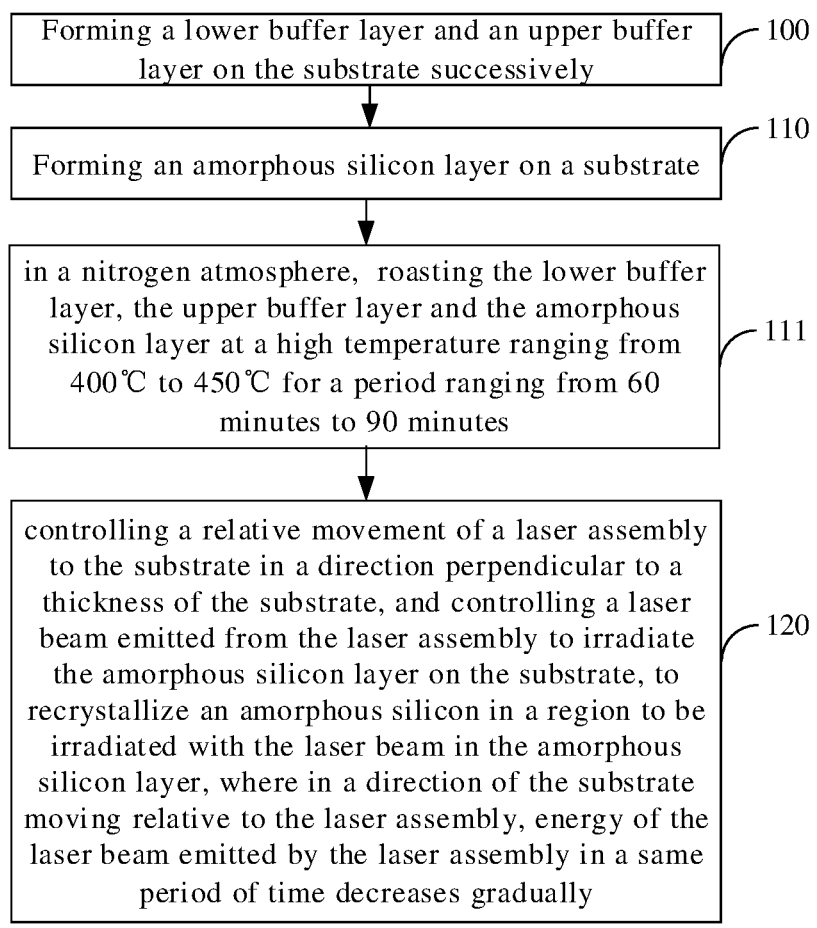
FIG. 2 is a flowchart of a method for manufacturing a low temperature poly-silicon according to some embodiments.

In some embodiments, there is provided a method for manufacturing a low temperature poly-silicon, as shown in FIG. 2, and the method includes a step 110 and a step 120.

Figure 3:
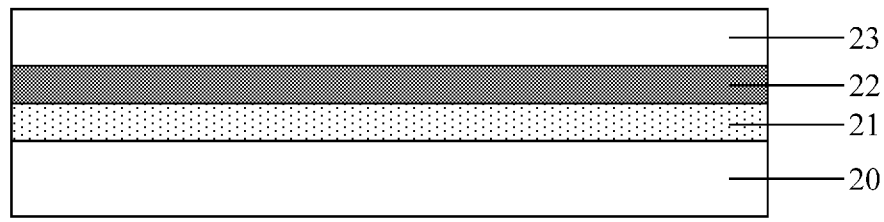
FIG. 3 is a structural schematic diagram of a substrate and a poly-silicon layer according to some embodiments.

In the step 110, as shown in FIG. 3, an amorphous silicon layer 23 is formed on a substrate 20.

In some embodiments, before forming the amorphous silicon layer 23, the method further includes a step 100.

In the step 100, a lower buffer layer 21 and an upper buffer layer 22 are formed on the substrate 20 successively. The lower buffer layer 20 is made of $SiN_x$, with a thickness ranging from 50 nm to 100 nm. The upper buffer layer 22 is made of $SiO_x$, with a thickness ranging from 200 nm to 300 nm. The lower buffer layer 21 and the upper buffer layer 22 insulate the substrate 20 from the amorphous silicon layer 23. For example, in the subsequent process, when the amorphous silicon layer 23 is irradiated with a laser beam, an influence of irradiation temperature on the substrate 20 is reduced.

Figure 4A:
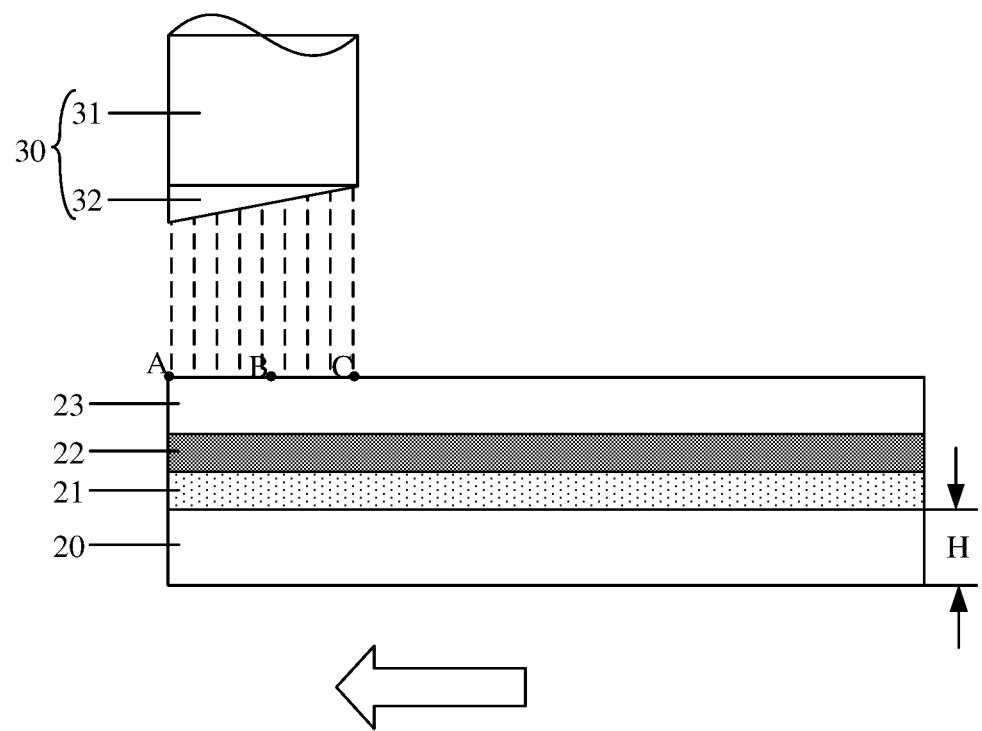
FIG. 4*a* is a schematic diagram of a laser assembly in an initial state in the method for manufacturing a low temperature poly-silicon according to some embodiments.
Figure 4B:
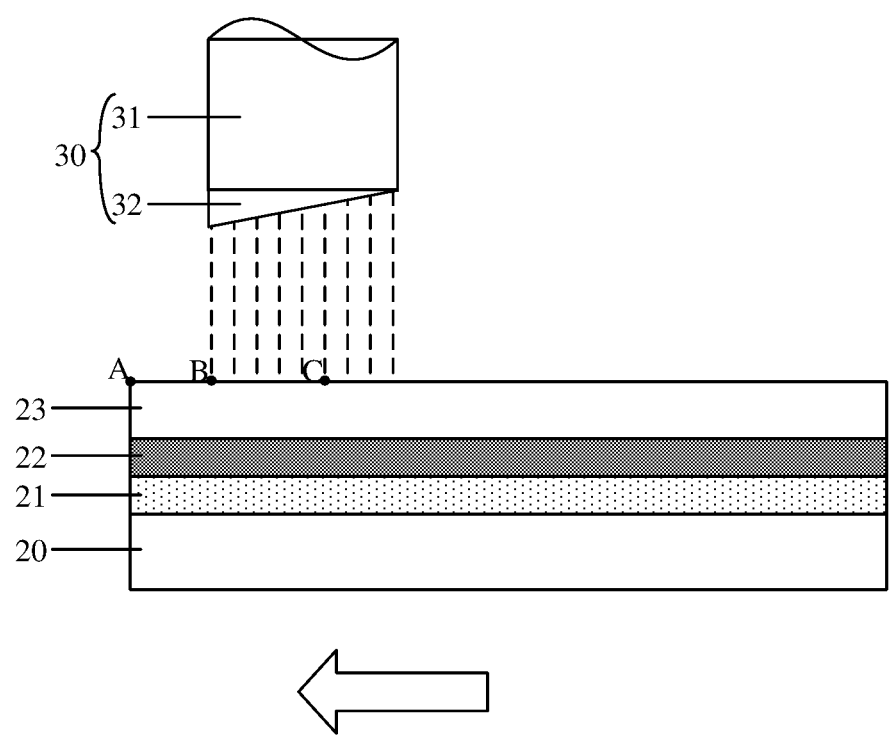
FIG. 4*b* is a schematic diagram of the laser assembly moving relative to a substrate in the method for manufacturing a low temperature poly-silicon illustrated in FIG. 4*a*.

In the step 120, as shown in FIGS. 2, 4a and 4b, in a direction perpendicular to a thickness H of the substrate 20, the movement of the laser assembly 30 relative to the substrate 20 is controlled, and a laser beam emitted from the laser assembly 30 is controlled to irradiate the amorphous silicon layer 23 on the substrate 20 gradually, to recrystallize the amorphous silicon within a region of the amorphous silicon layer 23, which is irradiated with the laser beam emitted from the laser assembly 30. In a direction of the substrate 20 moving relative to the laser assembly 30, energy of the laser beam emitted by the laser assembly 30 in a same period of time decreases gradually. As shown in FIG. 4a, an arrow below the substrate 20 indicates the direction of the substrate 20 moving relative to the laser assembly 30.

In some embodiments, as shown in FIG. 2, after the step 110 and before the step 120, the method further includes a step 111.

In the step 111, in a nitrogen atmosphere, the lower buffer layer 21, the upper buffer layer 22 and the amorphous silicon layer 23 are roasted at a high temperature ranging from 400° C. to 450° C. for a period ranging from 60 minutes to 90 minutes, to remove hydrogen in the lower buffer layer 21, the upper buffer layer 22 and the amorphous silicon layer 23, and prevent abnormal recrystallization due to hydrogen overflow when recrystallizing the amorphous silicon layer 23 in the subsequent process.

In some embodiments, the substrate 20 is a rigid substrate. For example, the rigid substrate is made of glass. In some embodiments, the substrate 20 is a flexible substrate. For example, the flexible substrate is made of Polyimide (PI).

In some embodiments, in order to realize the same intensity and time of laser irradiation on each part of the amorphous silicon layer 23 on the substrate 20, the movement of the laser assembly 30 relative to the substrate 20 in a direction perpendicular to the thickness of the substrate 20 has a uniform velocity.

In some embodiments, the direction of the substrate 20 moving relative to the laser assembly 30 is indicated by a direction of an arrow pointing to below the substrate in FIGS. 4a and 4b.

For example, the initial state of the laser assembly 30 is as shown in FIG. 4a, and the energy of the laser beam in a direction of a line formed by three points of A, B and C increases gradually. An energy of a laser beam received at the point A is the lowest, an energy of a laser beam received at the point C is the highest, and an energy of a laser beam received at the point B between the points A and C is smaller than the energy of a laser beam received at the point C and greater than the energy of a laser beam received at the point B. As the substrate 20 moves relative to the laser assembly 30, the positions of the substrate 20 and the laser assembly 30 are as shown in FIG. 4b, the point A is located outside the region irradiated with the laser beam, the energy of a laser beam received at the point B is the lowest, and the energy of a laser beam received at the point C is less than that in FIG. 4a.

The movement of the laser assembly 30 relative to the substrate 20 in the direction perpendicular to the thickness of the substrate 20 includes the following four cases.

In one case, the substrate 20 does not move, and the laser assembly 30 moves in the direction perpendicular to the thickness of the substrate 20.

In another case, the laser assembly 30 does not move, and the substrate 20 moves in the direction perpendicular to the thickness of the substrate 20. In this case, an entire surface of the amorphous silicon layer 23 on the substrate 20 may be irradiated by a stable laser beam.

In another case, the substrate 20 and the laser assembly 30 move oppositely in the direction perpendicular to the thickness of the substrate 20.

In another case, the substrate 20 and the laser assembly 30 move in a same direction perpendicular to the thickness of the substrate 20 with different speeds.

The thickness H of the substrate 20 refers to the direction perpendicular to a surface of the substrate 20 provided with the amorphous silicon layer 23.

In some embodiments, the laser beam emitted from the laser assembly 30 irradiates the entire surface of the amorphous silicon layer 23. In some embodiments, some part of a surface of the amorphous silicon layer 23 is irradiated.

Exemplarily, taking the laser beam emitted from the laser assembly 30 irradiating the entire surface of the amorphous silicon layer 23 as an example, the substrate 20 has a length of 400 mm and a width of 300 mm. The laser beam emitted from the laser assembly 30 irradiates a part of the entire surface of the amorphous silicon layer 23 along a length direction of the substrate 20, and then continues to irradiate other part of the entire surface region of the amorphous silicon layer 23 without irradiated with the laser beam in the same above-mentioned direction, until the entire surface of the amorphous silicon layer 23 is irradiated with the laser beam.

The process of recrystallizing the amorphous silicon in a region irradiated with the laser beam in the amorphous silicon layer 23 includes the following steps.

The amorphous silicon in the amorphous silicon layer 23 is irradiated with the laser beam emitted from the laser assembly 30, and amorphous silicon irradiated with the laser beam emitted from the laser assembly 30 turns into a molten state from a solid state. With the relative movement of the laser assembly 30 to the substrate 20, the amorphous silicon in a molten state is no longer irradiated by the laser beam, cooling and crystallizing gradually, and the cooled and crystallized amorphous silicon turns into the low temperature poly-silicon in a solid state.

In some embodiments, the amorphous silicon in the molten state is cooled and crystallized naturally after being irradiated by the laser beam emitted from the laser assembly 30.

In "in the direction of the substrate 20 moving relative to the laser assembly 30, the energy of the laser beam emitted from the laser assembly 30 in the same period of time decreases gradually", the "same period of time" indicates that at any moment, the laser beam emitted from the laser assembly 30 irradiates one region on the amorphous silicon layer 23, and in a direction of the substrate 20 moving relative to the laser assembly 30, an energy of a laser beam received by the region decreases gradually.

When this region is irradiated by the laser beam emitted from the laser assembly 30, each part of the region is irradiated for a same time, without causing different energies of laser beams received by the amorphous silicon in this region due to different irradiating time.

In "in the direction of the substrate 20 moving relative to the laser assembly 30, the energy of the laser beam emitted from the laser assembly 30 in the same period of time decreases gradually", the "the energy . . . decreases gradually" indicates that in a same period of time, the energy of the laser beam emitted from the laser assembly 30 has of a plurality of values, and in the direction of the substrate 20 moving relative to the laser assembly 30, energies of two adjacent laser beams tend to reduce.

In the method for manufacturing low temperature poly-silicon according to the above-mentioned embodiments, by controlling the energy of the laser beam emitted from the laser assembly in the same period of time to decrease gradually in the direction of the substrate moving relative to the laser assembly, the crystal grains of the low temperature poly-silicon grow from the position with a relatively low temperature to the position with a relatively high temperature. Compared with a method for manufacturing low temperature poly-silicon in the related art, the crystal grains in the low temperature poly-silicon manufactured by the method for manufacturing low temperature poly-silicon in the above-mentioned embodiment have relatively large sizes, and the quantity of crystal boundaries in the low temperature poly-silicon is reduced. In the case that the low temperature poly-silicon manufactured by the method for manufacturing low temperature poly-silicon according to the above-mentioned embodiment is used to make the active layer in the thin film transistor, the leak current of the thin film transistor is reduced, the phenomenon of unstable threshold voltage of the thin film transistor is reduced, and the stability and reliability of the thin film transistor are improved.

On the basis of the above-mentioned manufacturing methods, the direction of the substrate moving relative to the laser assembly is opposite to the growth direction of the crystal grains, to get parts of the amorphous silicon in the molten state with a relatively low temperature to cool and crystallize earlier than parts with a relatively high temperature, increasing the cooling time of the amorphous silicon in the molten state of any region. In the case of same growth speed of the crystal grains. Compared with the related art, the amorphous silicon manufactured through the manufacturing method according to the above-mentioned embodiments has a relatively large crystal grain size. The crystal grain size equals to a product of the cooling time and the growth speed.

"The cooling time of the amorphous silicon in the molten state of any region" refers to the following example.

As shown in FIG. 4(a), a region of the amorphous silicon irradiated by the laser beam emitted from the laser assembly is the one enclosed by the points A and C.

Taking the region enclosed by the points A and C as an example, the substrate 20 moves relative to the laser assembly 30. When only the point A is not irradiated by the laser beam emitted from the laser assembly and starts to cool, the time of starting cooling at the point A is denoted as t1; the substrate 20 continues to move relative to the laser assembly 30, until the point C cools to the crystallization temperature, and this time is denoted as t2. The cooling time required by the region enclosed by the points A and C is (t2−t1).

The region of the amorphous silicon irradiated by the laser beam emitted from the laser assembly at only one above time is taken as the any region. In some embodiments, an area of the any region is larger than an area of the region of the amorphous silicon irradiated by the laser beam emitted from the laser assembly at one moment. In some embodiments, an area of the any region is less than an area of the region of the amorphous silicon irradiated by the laser beam at one moment. That is, the any region is a region of the amorphous silicon irradiated by the laser beam emitted from the laser assembly.

In some embodiments, the laser assembly 30 includes a laser emitter 31 and an optical thin film 32. The laser emitter 31 is configured to emit the laser beam with substantially uniform energy. In some embodiments, substantially uniform energy is energy having a difference of a maximum energy and a minimum energy of about 2% of the minimum energy.

Figure 5:
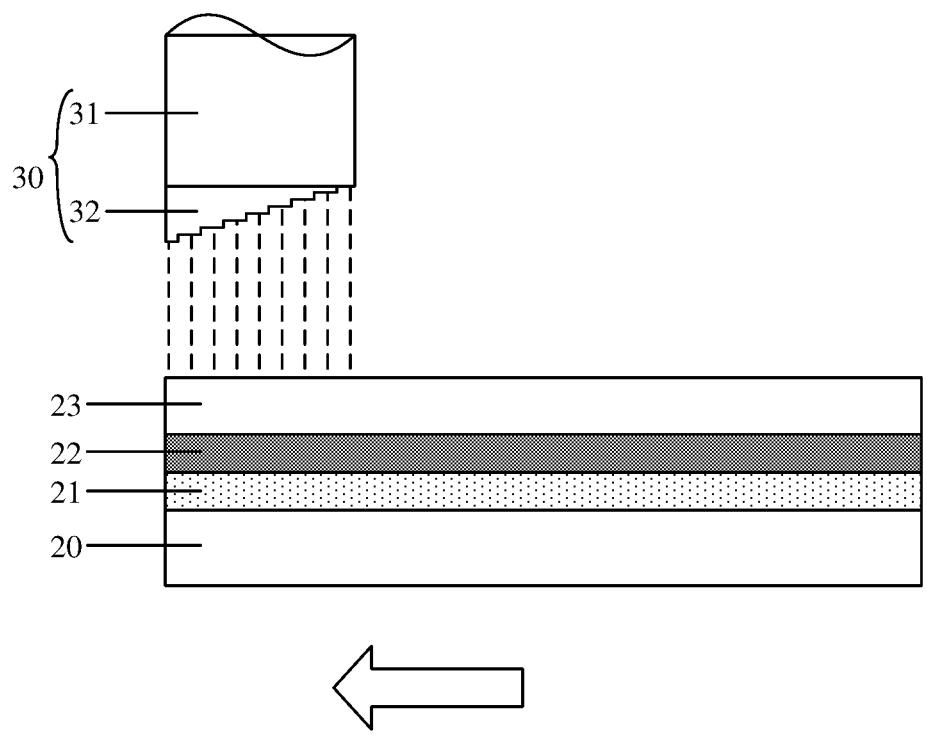
FIG. 5 is a schematic diagram of a process for manufacturing a low temperature poly-silicon according to some embodiments.

In some embodiments, as shown in FIGS. 4a and 5, the optical thin film 32 is fixed on a laser egress of the laser emitter 31.

In some embodiments, as shown in FIGS. 6, 7, 8 and 9, the optical thin film 32 is hung between the laser emitter 31 and the amorphous silicon layer 23, a laser beam emitted from the laser emitter 31 is incident onto the optical thin film 32, and the relative position of the optical thin film 32 to the laser emitter 31 is constant. In the direction of the substrate 20 moving relative to the laser assembly 30 (the direction indicated by the arrow below the substrate 20), the transmittance of the optical thin film 32 decreases gradually, to gradually reduce the energy of the laser beam emitted from the laser assembly 30 in the same period of time.

In some embodiments, the optical thin film 32 is arranged on a table. Since there is no relative displacement between the optical thin film 32 and the laser emitter 31, and the laser assembly 30 including the laser emitter 31 and the optical thin film 32 moves relative to the substrate 20, the table for placing the substrate 20 and a table for placing the optical thin film 32 are different tables.

In some embodiments, the laser emitter 31 is configured to emit the laser beam with substantially uniform energy, which indicates that at all parts of the laser egress of the laser emitter 31, the energy of the laser beam emitted from the laser emitter 31 have same or similar values. In some embodiments, at parts of the laser egress of the laser emitter 31, the energy of the laser beam emitted from the laser emitter 31 has a same value.

The material of the optical thin film 32 makes its transmittance in the direction of the substrate 20 moving relative to the laser assembly 30 decrease gradually.

The optical thin film 32 is fixed on the laser egress of the laser emitter 31. For example, the optical thin film 32 is attached to the laser egress of the laser emitter 31.

In some embodiments, the optical thin film 32 and the laser emitter 31 move in a same speed. In some embodiments, neither of the optical thin film 32 nor the laser emitter 31 moves, to keep a relative position of the optical thin film 32 to the laser emitter 31 unchanged.

In some embodiments, the laser emitter 31 emits a linear laser beam. For example, the laser emitter 31 is a Xe-cl laser which emits a laser beam with a wavelength of 308 mm and a frequency ranging from 100 Hz to 300 Hz.

In above embodiments, the laser assembly 30 including the laser emitter 31 and the optical thin film 32, has a simple structure and is easily manufactured. Compared with a structure in which the optical thin film 32 is hung between the laser emitter 31 and the amorphous silicon layer, the optical thin film 32 fixed on the laser egress of the laser emitter 31 does not include structures used to fix the optical thin film 32 to the laser emitter 31.

Compared with a structure in which the optical thin film 32 is fixed on the laser egress of the laser emitter 31, the optical thin film 32 hung between the laser emitter 31 and the amorphous silicon layer, simplifies the manufacturing process of the laser assembly.

In some embodiments, as shown in FIGS. 4a and 4b, the optical thin film 32 is attached to the laser egress of the laser emitter 31, a surface of the optical thin film 32 away from the laser emitter 31 is flat, and the surface of the optical thin film 32 away from the laser emitter 31 intersects with a surface of the optical thin film 32 attached on the laser emitter 31 (that is, the surface of the optical thin film away from the laser emitter is oblique).

In some embodiments, as shown in FIG. 5, the optical thin film 32 is attached on the laser egress of the laser emitter 31, and the surface of the optical thin film 32 away from the laser emitter 31 has a step shape.

Figure 6:
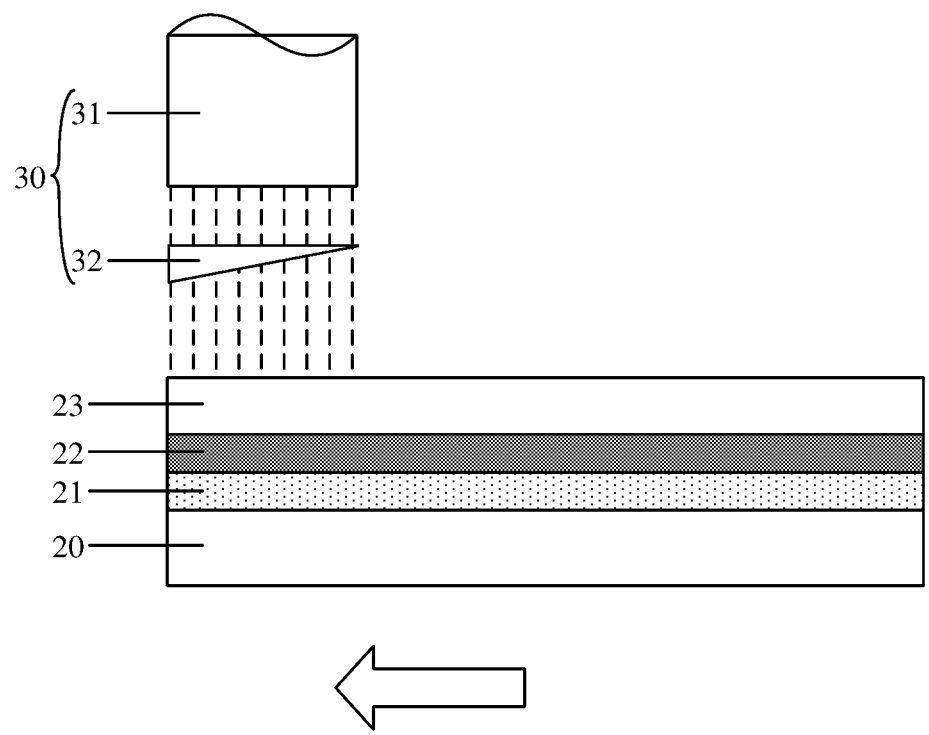
FIG. 6 is a schematic diagram of a process for manufacturing a low temperature poly-silicon according to some embodiments.

In some embodiments, as shown in FIG. 6, the optical thin film 32 is hung between the laser emitter 31 and the amorphous silicon layer 23, the optical thin film 32 does not contact with the laser egress of the laser emitter 31, and the optical thin film 32 does not contact with the amorphous silicon layer 23, the surface of the optical thin film 32 away from the laser emitter 31 is flat, and the surface of the optical thin film 32 away from the laser emitter 31 intersects with the surface of the optical thin film 32 close to the laser emitter 31 (that is, the surface of the optical thin film 32 away from the laser emitter 31 is oblique).

Figure 7:
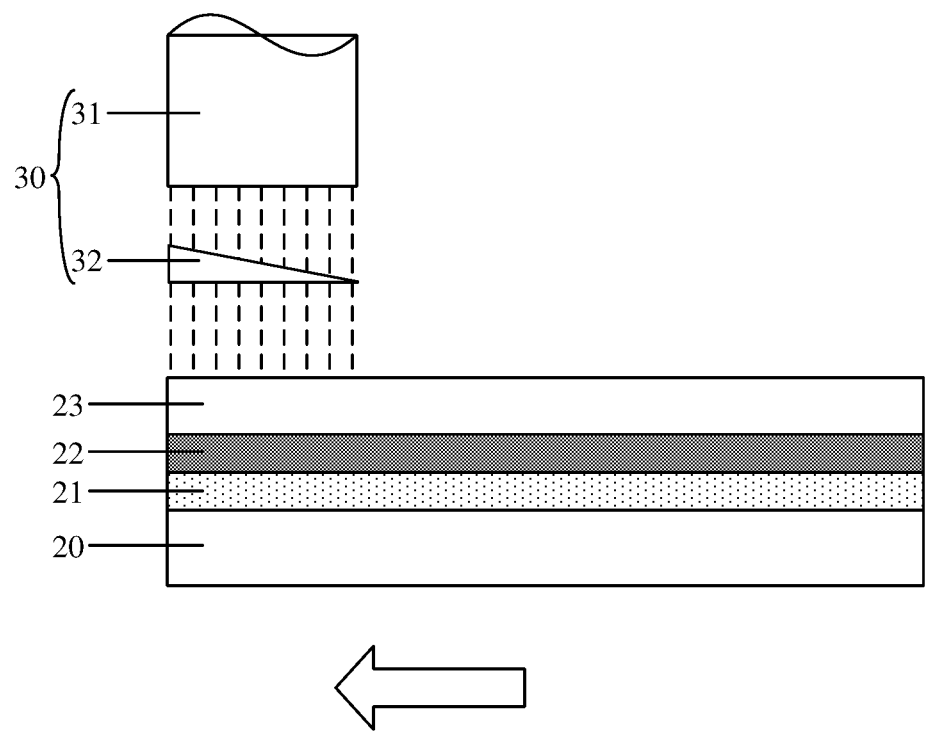
FIG. 7 is a schematic diagram of a process for manufacturing a low temperature poly-silicon according to some embodiments.

In some embodiments, as shown in FIG. 7, the optical thin film 32 is hung between the laser emitter 31 and the amorphous silicon layer 23, the optical thin film 32 does not contact with the laser egress of the laser emitter 31, and the optical thin film 32 does not contact with the amorphous silicon layer 23, the surface of the optical thin film 32 close to the laser emitter 31 is flat, the surface of the optical thin film 32 away from the laser emitter 31 is flat, and the surface of the optical thin film 32 away from the laser emitter 31 intersects with the surface of the optical thin film 32 close to the laser emitter 31 (that is, the surface of the optical thin film 32 close to the laser emitter 31 is oblique).

Figure 8:
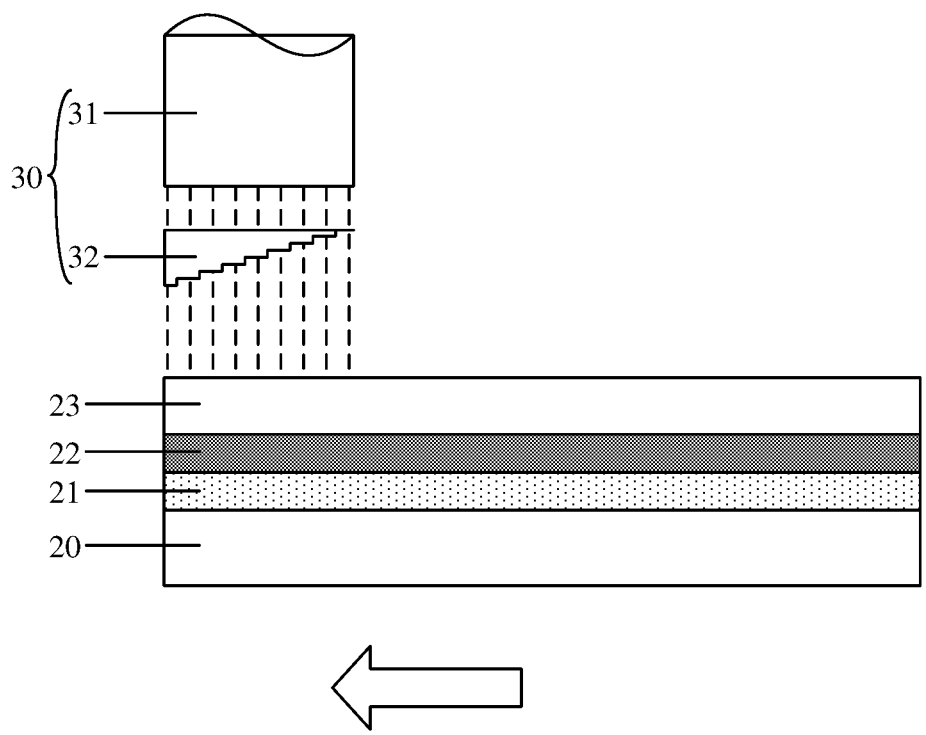
FIG. 8 is a schematic diagram of a process for manufacturing a low temperature poly-silicon according to some embodiments.

In some embodiments, as shown in FIG. 8, the optical thin film 32 does not contact with the amorphous silicon layer 23, the optical thin film 32 is hung between the laser emitter 31 and the amorphous silicon layer 23, the surface of the optical thin film 32 away from the laser emitter 31 has a step shape, and the surface of the optical thin film 32 close to the laser emitter 31 is flat.

Figure 9:
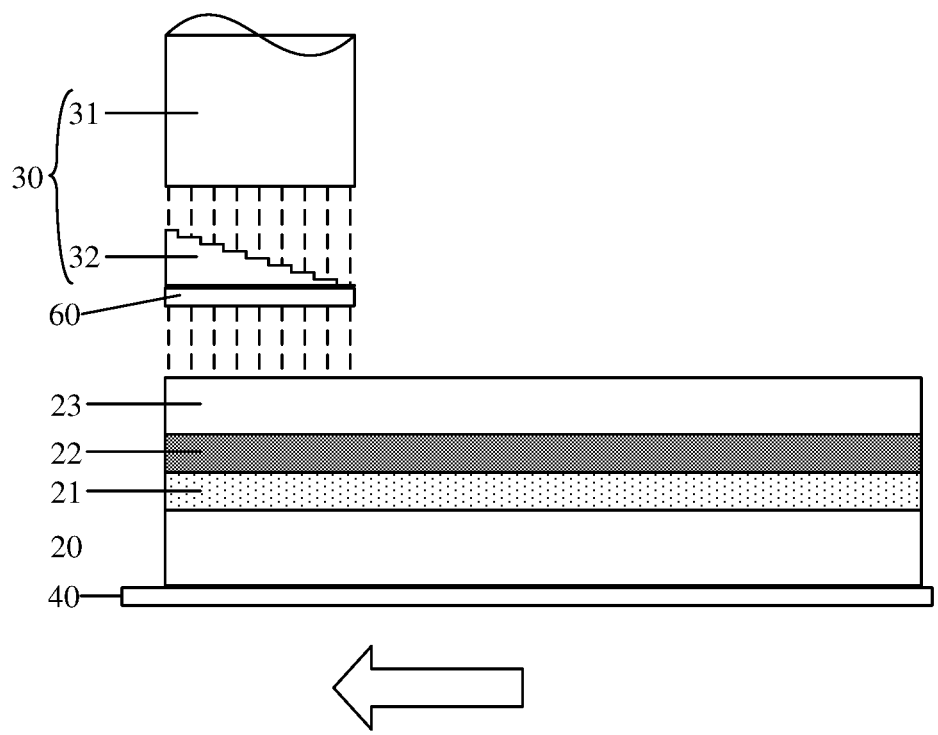
FIG. 9 is a schematic diagram of a process for manufacturing a low temperature poly-silicon according to some embodiments.

In some embodiments, as shown in FIG. 9, the optical thin film 32 does not contact with the amorphous silicon layer 23, the optical thin film 32 is hung between the laser emitter 31 and the amorphous silicon layer 23, the surface of the optical thin film 32 away from the laser emitter 31 is flat, and the surface of the optical thin film 32 close to the laser emitter 31 has a step shape.

The different thicknesses of the optical thin film 32 may realize different transmittances. For example, the optical thin film 32 is made of a very thin metal material with a thickness ranging from 0.02 um to 0.08 um.

In the above-mentioned embodiments, the different thicknesses of the optical thin film 32 may realize different transmittances. A first side of the optical thin film 32 is oblique, and a second surface of the optical thin film 32 is flat, to multiply gradients of the energy of the laser beam emitted from the laser assembly 30, which increases the crystal grain size. The optical thin film 32 with a step-shaped first side in a step shape and a flat second side is easily manufactured technically.

The shape of the optical thin film 32 realizes different transmittances by different thicknesses of the optical thin film 32, and in the direction of the substrate 20 moving relative to the laser assembly 30, the transmittance of the optical thin film 32 decreases gradually.

In some embodiments, in the case that the optical thin film 32 is arranged on the laser egress of the laser emitter 31, the surface of the optical thin film 32 away from the laser emitter 31 has a step shape or is oblique, and the surface of the optical thin film 32 close to the laser emitter 31 is flat.

In some embodiments, in the case that the optical thin film 32 is arranged on the laser egress of the laser emitter 31, and the surface of the optical thin film 32 close to the laser emitter 31 is flat, which facilitates the fixation of the optical thin film 32 on the laser emitter 31.

In some embodiments, the optical thin film 32 has a minimal transmittance Xmin and a maximal transmittance Xmax, and 1%≤Xmin<Xmax≤100%.

In some embodiments, by choosing the minimal transmittance of the optical thin film 32 larger than or equal to 1% and the maximal transmittance less than or equal to 100%, the energy irradiated on the amorphous silicon layer 23 by the laser beam emitted from the laser emitter 31 passing through the optical thin film 32 melt the amorphous silicon.

In some embodiments, in a direction of the substrate 20 moving relative to the laser assembly 30, the energy of the laser beam emitted by the laser assembly 30 in the same period of time has at least three different values.

In the above embodiments, since the more the gradients of the energy of the laser beam emitted from the laser assembly 30 in the same period of time (that is, the quantity of energy values), the longer the time of cooling the amorphous silicon is, and lower the possibility of breakage during cooling occurs. Therefore, in the direction of the substrate 20 moving relative to the laser assembly 30, by choosing energy of the laser beam emitted from the laser assembly 30 in the same period of time having at least three different values, the crystal grain size increases.

In some embodiments, in the direction of the substrate 20 moving relative to the laser assembly 30, the laser beam emitted by the laser assembly has a width ranging from 0.4 mm to 1 mm.

In the above-mentioned embodiment, by controlling the width of the laser beam emitted from the laser emitter 31 to be within 0.4 mm and 1 mm, the energy of the laser beam emitted from the laser emitter 31 becomes more uniform and concentrated. The width of the laser beam emitted from the laser emitter 31 is related to width of the laser egress of the laser emitter 31. The larger the width of the laser egress of the laser emitter 31, the higher the cost. Therefore, a width of the laser beam emitted from the laser emitter 31 is controlled within the range of 0.4 mm to 1 mm, reducing the production cost.

Some embodiments provide low temperature poly-silicon, made by the method for manufacturing low temperature poly-silicon according to any one of the above-mentioned embodiments.

By controlling the energy of the laser beam emitted from the laser assembly 30 in the same period of time to decrease gradually in the direction of the substrate 20 moving relative to the laser assembly 30, the crystal grains of the low temperature poly-silicon grow from the position with a relatively low temperature to the position with a relatively high temperature, finally forming the low temperature poly-silicon.

Compared with a low temperature poly-silicon in a related art, the crystal grain size of the low temperature poly-silicon is increased, thereby reducing the quantity of the crystal boundaries in the low temperature poly-silicon. In the case that the above-mentioned low temperature poly-silicon is used to make the active layer in the thin film transistor, the leak current of the thin film transistor is reduced, the phenomenon of unstable threshold voltage of the thin film transistor is further reduced, and the stability and reliability of the thin film transistor are improved.

Based on the above-mentioned embodiments, since the direction of the substrate 20 moving relative to the laser assembly 30 is opposite to the growth direction of crystal grains, the amorphous silicon in the molten state in a region with a relatively low temperature cools and crystallizes earlier than that in a region with a relatively high temperature, prolonging the cooling time of the amorphous silicon in the molten state, and increasing the crystal grain size.

The crystal grain size equals to a product of the cooling time and a growth speed. In the above-mentioned embodiment, the cooling time of the amorphous silicon in the molten state of any region is prolonged. In the case of a same growth speed of the crystal grains, compared with the amorphous silicon in the related art, the crystal grain size in the above-mentioned embodiment is increased.

Some embodiments provide a thin film transistor including an active layer, and the material of the active layer includes the low temperature poly-silicon in the above-mentioned embodiments.

In some embodiments, the thin film transistor further includes a gate electrode, a gate insulating layer, a source electrode and a drain electrode. In some embodiments, the thin film transistor has a bottom-gate structure. In some embodiments, the thin film transistor has a top-gate structure.

Some embodiments provide an array substrate including the thin film transistor in the above-mentioned embodiments.

Some embodiments provide a display device including the array substrate in the above-mentioned embodiments.

In some embodiments, the display device is a display panel. In some embodiments, the display device is a display including a display device, for example, an organic light emitting display (OLED) or a liquid crystal display.

Some embodiments provide a device for manufacturing low temperature poly-silicon, and the device includes a laser assembly 30, a first table 40 and a moving structure 50. The first table 40 is configured to place the substrate 20. The moving structure 50 is configured to move the laser assembly 30 relative to the substrate 20 gradually in a direction perpendicular to the thickness of the substrate 20. The laser assembly 30 is configured to emit a laser beam. The laser beam gradually irradiates the amorphous silicon layer 23 on the substrate 20, to recrystallize the amorphous silicon of a region irradiated by the laser beam in the amorphous silicon layer 23. In the direction of the substrate 20 moving relative to the laser assembly 30, energy of the laser beam emitted by the laser assembly 30 in the same period of time decreases gradually.

In some embodiments, in order to realize a same laser irradiation on each part of the amorphous silicon layer 23 on the substrate 20, the movement of the laser assembly 30 relative to the substrate 20 in the direction perpendicular to the thickness of the substrate 20 has a uniform velocity.

The moving structure 50 is configured to move the laser assembly 30 relative to the substrate 20 in the direction perpendicular to the thickness of the substrate 20. The relative movement includes the following cases.

Figure 10A:
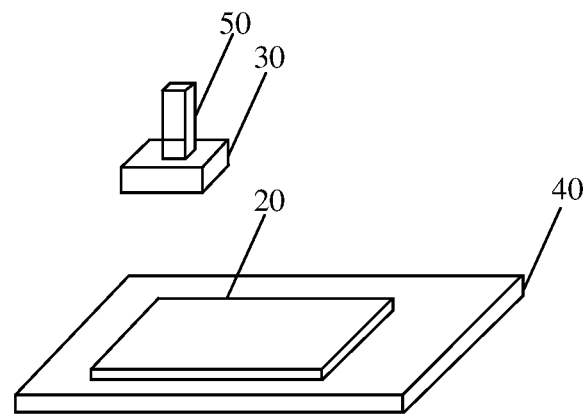
FIG. 10*a* is a structural schematic diagram of a device for manufacturing a low temperature poly-silicon according to some embodiments.

In one case, as shown in FIG. 10a, the laser assembly 30 is connected with the moving structure 50, the substrate 20 does not move, and the laser assembly 30 moves gradually in the direction perpendicular to the thickness of the substrate 20.

Figure 10B:
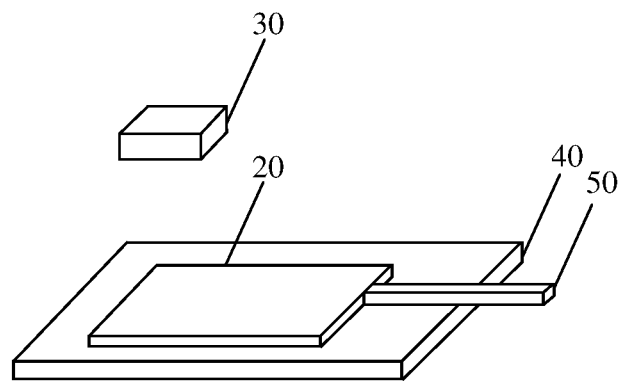
FIG. 10*b* is a structural schematic diagram of a device for manufacturing a low temperature poly-silicon according to some other embodiments.

In another case, as shown in FIG. 10b, the substrate 20 is connected with the moving structure 50, the laser assembly 30 does not move, and the substrate 20 moves gradually in the direction perpendicular to the thickness of the substrate 20. In this case, each region of the amorphous silicon layer 23 on the substrate 20 is irradiated stably by the laser beam emitted from the laser assembly 30.

Figure 10C:
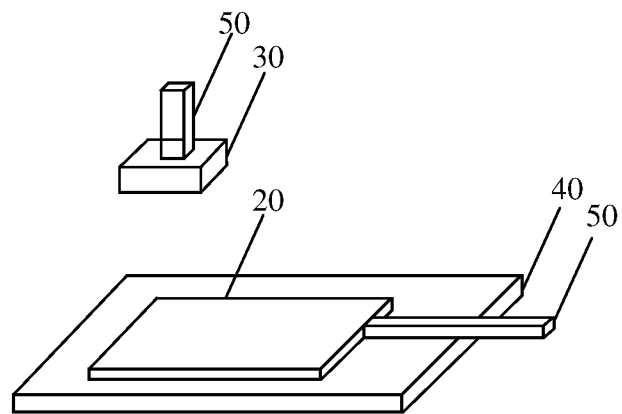
FIG. 10*c* is a structural schematic diagram of a device for manufacturing a low temperature poly-silicon according to some other embodiments.

In another case, as shown in FIG. 10c, the laser assembly 30 and the substrate 20 are connected with different moving structures 50, and the substrate 20 and the laser assembly 30 move oppositely in the direction perpendicular to the thickness of the substrate 20.

In another case, as shown in FIG. 10c, the laser assembly 30 and the substrate 20 are connected with different moving structures 50, and the substrate 20 and the laser assembly 30 move in a same direction perpendicular to the thickness of the substrate 20 at different speeds.

The thickness direction of the substrate 20 refers to the direction perpendicular to a surface of the substrate 20 provided with the amorphous silicon layer 23.

In some embodiments, the laser beam emitted from the laser assembly 30 irradiates an entire surface of the amorphous silicon layer 23. In some embodiments, some part of the entire surface of the amorphous silicon layer 23 is irradiated by the laser assembly 30.

Exemplarily, taking the laser beam emitted from the laser assembly 30 radiating the entire surface of the amorphous silicon layer 23 as an example, the substrate 20 has a length of 400 mm and a width of 300 mm. The laser beam emitted from the laser assembly 30 irradiates one part of surface of the amorphous silicon layer 23 in a length direction of the substrate 20, and then continues to irradiate other part of the surface of the amorphous silicon layer 23, which is not irradiated by laser beams in the same above-mentioned direction, until the entire surface of the amorphous silicon layer 23 is irradiated by the laser beam.

In some embodiments, the process of recrystallizing the amorphous silicon in a region in the amorphous silicon layer 23, which is irradiated by the laser beam, includes the following steps.

The amorphous silicon in the amorphous silicon layer 23 is irradiated by the laser beam, and transfers into a molten state from a solid state. With the relative movement of the laser assembly 30 to the substrate 20, the amorphous silicon in a molten state is no longer irradiated by the laser beam, cooling and crystallizing gradually, and then amorphous silicon is converted into the low temperature poly-silicon in a solid state.

In some embodiments, the amorphous silicon in the molten state is cooled and crystallized naturally after there is no laser radiation any more.

In "in the direction of the substrate 20 moving relative to the laser assembly 30, the energy of the laser beam emitted from the laser assembly 30 in the same period of time decreases gradually", the "same period of time" indicates that at any time, the laser beam emitted from the laser assembly 30 irradiates one region on the amorphous silicon layer 23, and in a direction of the substrate 20 moving relative to the laser assembly 30, an energy of a laser beam received by the region decreases gradually.

When this region is irradiated, each part of the region is irradiated for a same time, without causing different energies of laser beams received by the amorphous silicon in this region due to different radiation time.

In "in the direction of the substrate 20 moving relative to the laser assembly 30, the energy of the laser beam emitted from the laser assembly 30 in the same period of time decreases gradually", the "the energy . . . decreases gradually" indicates that in the same period of time, the energy of the laser beam emitted from the laser assembly 30 has a plurality of values, and in the direction of the substrate 20 moving relative to the laser assembly 30, energies of two adjacent laser beams tend to reduce.

In some embodiments, the laser assembly 30 includes a laser emitter 31 and an optical thin film 32. The laser emitter 31 is configured to emit the laser beam with substantially uniform energy. In some embodiments, as shown in FIGS. 4a and 5, the optical thin film 32 is fixed on a laser egress of the laser emitter 31. In some embodiments, as shown in FIGS. 6 to 9, the optical thin film 32 does not contact with the laser egress of laser emitter 31, the optical thin film 32 is hung between the laser emitter 31 and the amorphous silicon layer 23, the laser beam emitted from the laser emitter 31 is incident onto the optical thin film 32, and the relative position of the optical thin film 32 to the laser emitter 31 does not change. In a direction of the substrate 20 moving relative to the laser assembly 30, the transmittance of the optical thin film 32 decreases gradually, to gradually reduce the energy of the laser beam emitted from the laser assembly 30 in the same period of time.

In some embodiments, as shown in FIG. 9, the optical thin film 32 is arranged on a second table 60. Since there is no relative displacement between the optical thin film 32 and the laser emitter 31, the laser assembly 30 including the laser emitter 31 and the optical thin film 32 moves relative to the substrate 20. Therefore, a first table 40 (the table referred above) for placing the substrate 20 and the second table 60 for placing the optical thin film 32 are different tables.

The laser emitter 31 is configured to emit the laser beam with substantially uniform energy, which means that at all parts of the laser egress of the laser emitter 31, the energy of the laser beam emitted from the laser emitter 31 have same or similar values. In some embodiments, at each position of the laser egress of the laser emitter 31, the energy of the laser beam emitted from the laser emitter 31 is the same.

The material of the optical thin film 32 makes its transmittance in the direction of the substrate 20 moving relative to the laser assembly 30 to decrease gradually.

In some embodiments, the optical thin film 32 is fixed on the laser egress of the laser emitter 31. For example, the optical thin film 32 is attached to the laser egress of the laser emitter 31.

In some embodiments, the optical thin film 32 and the laser emitter 31 move at a same speed. In some embodiments, neither of the optical thin film 32 nor the laser emitter 31 moves, to keep the relative position of the optical thin film 32 to the laser emitter 31 unchanged.

In some embodiments, the laser emitter 31 emits a linear laser beam. For example, the laser emitter 31 is a Xe-cl laser and emits a laser beam with a wavelength of 308 mm and a frequency ranging from 100 Hz to 300 Hz.

In the above-mentioned embodiments, the laser assembly 30 including a laser emitter 31 and an optical thin film 32, has a simple structure and is easily manufactured.

Compared with the structure in which the optical thin film 32 is hung between the laser emitter 31 and the amorphous silicon layer, the optical thin film 32 is fixed on the laser egress of the laser emitter 31, without other structures used to fix the optical thin film 32 to the laser emitter 31.

Compared with the structure in which the optical thin film 32 is fixed to the laser egress of the laser emitter 31, the optical thin film 32 hung between the laser emitter 31 and the amorphous silicon layer, simplifies the manufacturing process of the laser assembly.

The laser assembly 30 according to the above-mentioned embodiments includes the laser emitter 31 and the optical thin film 32. The laser emitter 31 is configured to emit the laser beam with substantially uniform energy. In some embodiments, as shown in FIGS. 4a and 5, the optical thin film 32 is located on a laser egress of the laser emitter 31. In some embodiments, the optical thin film 32 is hung below the laser emitter 31, the laser beam emitted from the laser emitter 31 may be incident onto the optical thin film 32, and the relative position of the optical thin film 32 to the laser emitter 31 does not change. From the first side to the second side (opposite to the first side surface) of the optical thin film 32, the transmittance of the optical thin film 32 decreases gradually, to gradually reduce the energy of the laser beam emitted from the laser assembly 30 in the same period of time.

The laser emitter 31 is configured to emit the laser beam with substantially uniform energy, which means that at all parts of the laser egress of the laser emitter 31, the energy of the laser beam emitted from the laser emitter 31 has same or similar values. In some embodiments, at all parts of the laser egress of the laser emitter 31, the energy of the laser beam emitted from the laser emitter 31 is the same.

The material of the optical thin film 32 makes its transmittance in the direction of the substrate 20 moving relative to the laser assembly 30 reduce gradually.

In some embodiments, the optical thin film 32 is fixed on the laser egress of the laser emitter 31. For example, the optical thin film 32 is attached to the laser egress of the laser emitter 31.

In some embodiments, the optical thin film 32 and the laser emitter 31 move at a same speed. In some embodiments, neither of the optical thin film 32 nor the laser emitter 31 moves, to keep the relative position of the optical thin film 32 to the laser emitter 31 unchanged.

In some embodiments, the laser emitter 31 emits a linear laser beam. For example, the laser emitter 31 is a Xe-cl laser and emits the laser beam with a wavelength of 308 mm and a frequency ranging from 100 Hz to 300 Hz.

What is claimed is:

1. A method for manufacturing low temperature polysilicon, the method comprising:
    forming an amorphous silicon layer on a substrate; and
    controlling a relative movement of a laser assembly with respect to the substrate in a direction perpendicular to a thickness of the substrate, and controlling a laser beam emitted from the laser assembly to irradiate the amorphous silicon layer on the substrate, to recrystallize an amorphous silicon in a region to be irradiated with the laser beam in the amorphous silicon layer;
    wherein in a direction of the substrate moving relative to the laser assembly, energy of the laser beam emitted by the laser assembly in a same period of time decreases gradually.

2. The method according to claim 1, wherein the laser assembly comprises a laser emitter and an optical thin film;
    the laser emitter is configured to emit a laser beam with substantially uniform energy, and comprises a laser egress;
    the optical thin film is fixed on the laser egress; and
    in the direction of the substrate moving relative to the laser assembly, a transmittance of the optical thin film decreases gradually, to gradually reduce the energy of the laser beam emitted by the laser assembly in the same period of time.

3. The method according to claim 2, wherein a surface of the optical thin film away from the laser emitter has a step shape or is oblique, and a surface of the optical thin film close to the laser emitter is flat.

4. The method according to claim 2, wherein a surface of the optical thin film away from the laser emitter is flat, and a surface of the optical thin film close to the laser emitter has a step shape or is oblique.

5. The method according to claim 2, wherein the optical thin film has a minimal transmittance Xmin and a maximal transmittance Xmax, and wherein 1%≤Xmin<Xmax≤100%.

6. The method according to claim 1, wherein the laser assembly comprises a laser emitter and an optical thin film;
the laser emitter is configured to emit a laser beam with substantially uniform energy;
the optical thin film is hung between the laser emitter and the amorphous silicon layer, the laser beam emitted from the laser emitter is incident onto the optical thin film, and the optical thin film has a constant position relative to the laser emitter; and
in the direction of the substrate moving relative to the laser assembly, a transmittance of the optical thin film decreases gradually, to gradually reduce the energy of the laser beam emitted by the laser assembly in the same period of time.

7. The method according to claim 6, wherein a surface of the optical thin film away from the laser emitter has a step shape or is oblique, and a surface of the optical thin film close to the laser emitter is flat.

8. The method according to claim 6, wherein a surface of the optical thin film away from the laser emitter is flat, and a surface of the optical thin film close to the laser emitter has a step shape or is oblique.

9. The method according to claim 6, wherein the optical thin film has a minimal transmittance Xmin and a maximal transmittance Xmax, wherein $1\% \leq Xmin < Xmax \leq 100\%$.

10. The method according to claim 1, wherein in the direction of the substrate moving relative to the laser assembly, the energy of the laser beam emitted by the laser assembly in the same period of time has at least three different values.

11. The method according to claim 1, wherein in the direction of the substrate moving relative to the laser assembly, the laser beam emitted by the laser assembly has a width ranging from 0.4 mm to 1 mm.

12. A device for manufacturing low temperature polysilicon, the device comprising:
a table;
a moving structure; and
a laser assembly;
wherein the table is configured to place a substrate; and
wherein the moving structure is configured to drive the laser assembly and the substrate to move relative to each other gradually in a direction perpendicular to a thickness of the substrate; and
wherein the laser assembly is configured to emit a laser beam, wherein the laser beam irradiates an amorphous silicon layer on the substrate, to recrystallize an amorphous silicon in a region to be irradiated with the laser beam in the amorphous silicon layer; and
wherein in a direction of the substrate moving relative to the laser assembly, energy of the laser beam emitted by the laser assembly in a same period of time decreases gradually.

13. The device according to claim 12, wherein the laser assembly comprises a laser emitter and an optical thin film;
the laser emitter is configured to emit a laser beam with substantially uniform energy, and comprises a laser egress;
the optical thin film is fixed on the laser egress; and
in the direction of the substrate moving relative to the laser assembly, a transmittance of the optical thin film decreases gradually, to gradually reduce the energy of the laser beam emitted by the laser assembly in the same period of time.

14. The device according to claim 13, wherein a surface of the optical thin film away from the laser emitter has a step shape or is oblique, and a surface of the optical thin film close to the laser emitter is flat.

15. The device according to claim 13, wherein a surface of the optical thin film away from the laser emitter is flat, and a surface of the optical thin film close to the laser emitter has a step shape or is oblique.

16. The device according to claim 13, wherein the optical thin film has a minimal transmittance Xmin and a maximal transmittance Xmax, wherein $1\% \leq Xmin < Xmax \leq 100\%$.

17. The device according to claim 12, wherein the laser assembly comprises a laser emitter and an optical thin film;
the laser emitter is configured to emit the laser beam with substantially uniform energy;
the optical thin film is hung between the laser emitter and the amorphous silicon layer, the laser beam emitted from the laser emitter is incident onto the optical thin film, and the optical thin film has a constant position relative to the laser emitter; and
in the direction of the substrate moving relative to the laser assembly, a transmittance of the optical thin film decreases gradually, to gradually reduce the energy of the laser beam emitted by the laser assembly in the same period of time.

18. The device according to claim 17, wherein a surface of the optical thin film away from the laser emitter has a step shape or is oblique, and a surface of the optical thin film close to the laser emitter is flat.

19. The device according to claim 17, wherein a surface of the optical thin film away from the laser emitter is flat, and a surface of the optical thin film close to the laser emitter has a step shape or is oblique.

20. A laser assembly comprising:
a laser emitter; and
an optical thin film;
wherein the laser emitter is configured to emit a laser beam with substantially uniform energy, and comprises a laser egress; and
wherein the optical thin film is arranged on the laser egress, or the optical thin film is hung at one side of the laser emitter arranged with the laser egress, the laser beam emitted from the laser emitter is incident onto the optical thin film, and the optical thin film has a constant relative position to the laser emitter; and
wherein from a first end of the optical thin film to a second end opposite to the first end of the optical thin film, a transmittance of the optical thin film decreases gradually, to gradually reduce the energy of a laser beam emitted by the laser assembly in a same period of time.

* * * * *